US010269898B2

(12) United States Patent
Edwards et al.

(10) Patent No.: US 10,269,898 B2
(45) Date of Patent: Apr. 23, 2019

(54) SURROUNDED EMITTER BIPOLAR DEVICE

(71) Applicant: Texas Instruments Incorporated, Dallas, TX (US)

(72) Inventors: Henry Litzmann Edwards, Garland, TX (US); Akram A. Salman, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 307 days.

(21) Appl. No.: 14/713,867

(22) Filed: May 15, 2015

(65) Prior Publication Data

US 2015/0340358 A1    Nov. 26, 2015

Related U.S. Application Data

(60) Provisional application No. 62/001,799, filed on May 22, 2014.

(51) Int. Cl.

| H01L 29/866 | (2006.01) |
|---|---|
| H01L 29/06 | (2006.01) |
| H01L 29/73 | (2006.01) |
| H01L 29/417 | (2006.01) |
| H01L 27/02 | (2006.01) |

(52) U.S. Cl.
CPC ...... *H01L 29/0649* (2013.01); *H01L 27/0259* (2013.01); *H01L 29/41708* (2013.01); *H01L 29/7302* (2013.01); *H01L 29/73* (2013.01); *H01L 29/866* (2013.01)

(58) Field of Classification Search
CPC .......................... H01L 29/0821; H01L 29/866
See application file for complete search history.

(56) References Cited

U.S. PATENT DOCUMENTS

| 2001/0026984 | A1* | 10/2001 | Yun ..................... H01L 29/1095 438/309 |
| 2007/0105301 | A1* | 5/2007 | Chen ..................... H01L 29/735 438/234 |
| 2008/0203534 | A1* | 8/2008 | Xu ....................... H01L 27/0259 257/577 |
| 2010/0301453 | A1* | 12/2010 | Chung ................ H01L 27/0823 257/574 |
| 2012/0187538 | A1* | 7/2012 | Lin ..................... H01L 29/0821 257/587 |
| 2013/0320396 | A1 | 12/2013 | Salman et al. |

* cited by examiner

*Primary Examiner* — Lex H Malsawma
*Assistant Examiner* — Geoffrey H Ida
(74) *Attorney, Agent, or Firm* — Andrew R. Ralston; Charles A. Brill; Frank D. Cimino

(57) ABSTRACT

A surrounded emitter bipolar device includes a substrate having a p-epitaxial (p-epi) layer thereon, and a p-base in the p-epi layer. A two dimensional (2D) array of p-base contacts (base units) include the p-base, wherein each base unit includes an outer dielectric structure surrounding an inner dielectric isolation ring. The inner dielectric isolation ring surrounds an n region (n+moat). A first portion of the n+moats are collector (C) units, and a second portion of the n+moats are emitter (E) units. Each of the E units is separated from a nearest neighbor E unit by a C unit.

20 Claims, 4 Drawing Sheets

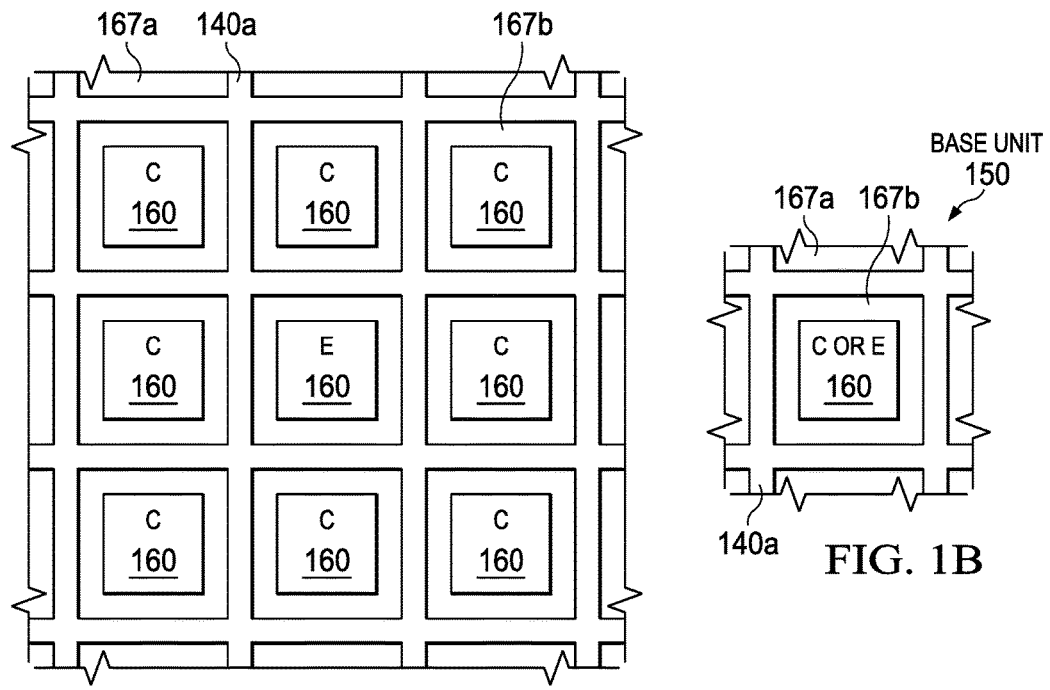
FIG. 1C
FIG. 1B
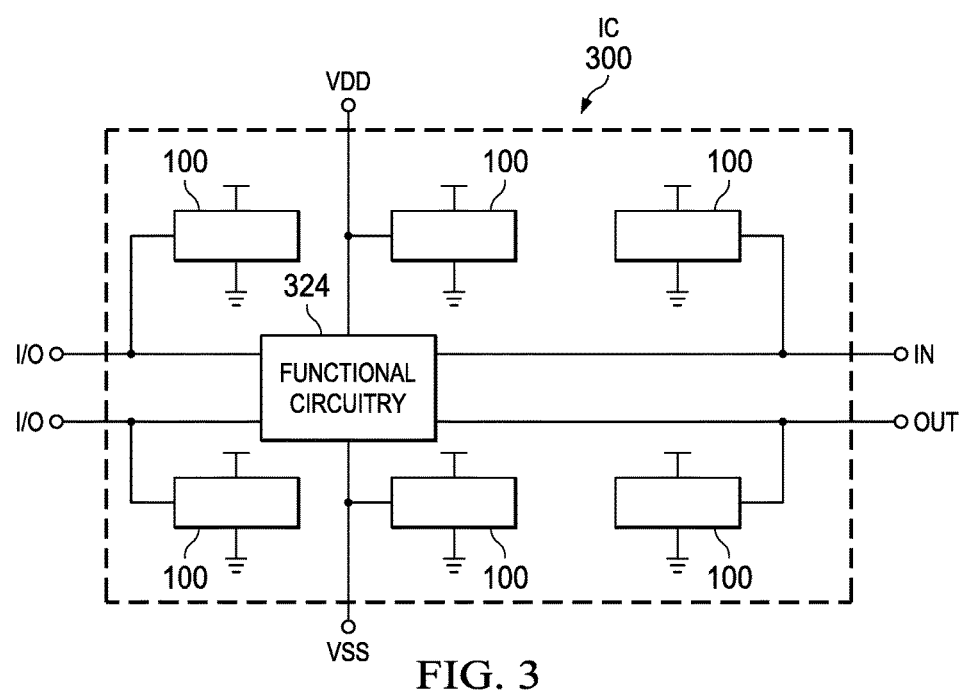
FIG. 3

SURROUNDED EMITTER BIPOLAR DEVICE

CROSS REFERENCE TO RELATED APPLICATIONS

This application claims the benefit of Provisional Application Ser. No. 62/001,799 entitled "Low Voltage Lateral ESD NPN" filed May 22, 2014, which is herein incorporated by reference in its entirety.

FIELD

Disclosed embodiments relate to bipolar devices for protecting integrated circuits from electrostatic discharge damage.

BACKGROUND

Modern high-density integrated circuits (ICs) are known to be vulnerable to damage from the electrostatic discharge (ESD) from a charged body (human or otherwise) as the charged body physically contacts the IC. ESD damage occurs when the amount of charge exceeds the capability of the electrical conduction path through the IC. The typical ESD failure mechanisms include thermal runaway resulting in junction shorting, and dielectric breakdown resulting in gate-junction shorting in the metal-oxide-semiconductor (MOS) context.

An IC may be subjected to a damaging ESD event in the manufacturing process, during assembly, testing, or in the system application. In conventional IC ESD protection schemes, active clamp circuits are generally used to shunt ESD current between the power supply rails and thereby protect internal IC element nodes that are connected to bond pads from ESD damage.

Conventional vertical NPN bipolar devices used for ESD protection of devices on an IC typically include a surface n-type region (e.g., surface nwell) on an n+ sinker diffusion that is on an n+ buried layer (NBL) which together provides a collector in one or more device stripes (or fingers) to provide a low resistance-path to carry ESD strike induced current back to the top surface (e.g., top of the surface nwell). In BiMOS technologies, it is a common practice to use such vertical NPN devices for the ESD protection circuitry.

For ESD protection of ESD sensitive pins, the clamping device is generally needed to not snap back below the rated supply voltage during the ESD strike. ESD NPN bipolar devices can be used for this purpose. In BiMOS technologies conventional vertical ESD NPN devices originally designed for 15V operation can be modified to reverse the emitter and collector pins to access the lower breakdown voltage of the n+ source/drain (NSD)-surface pwell (SPWELL) junction for collector-base junction breakdown. In addition, a conventional deep pwell diffusion can be added to increase the p-side doping level of the SPWELL to further reduce the collector-base junction breakdown voltage to provide about a 5V breakdown voltage.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include surrounded emitter lateral bipolar ESD devices with can provide a 5V (or other voltage) ESD NPN rating along with a reduced layout area, and with optional segmentation provide an increased resistance to filamentation during ESD events. Disclosed surrounded emitter bipolar ESD devices comprise a two dimensional (2D) array of p-base contacts (base units) each being connected to a p-base on an optional n+ buried layer (NBL) that is on a substrate. Each base unit includes a dielectric isolation ring within the p-base and an n+ active area (hereafter n+ moat) in an area enclosed by the dielectric isolation ring. A p+ base grid that contacts the p-base separates each n+ moat from a nearest neighbor n+ moat. Each base unit can be either a collector (C) or an emitter (E) unit.

A first metal layer (M1) generally clads the surface of each E and C unit, which can include surface silicide, and can include contact to optional collector rings and to the isolation ring. Also, M1 generally forms horizontal stripes that connect C units that are vertically in line with the E units, and a second metal layer (M2) is generally used to form connections that run out of each cell to avoid metal line collisions (shorts). "Segmented" or "segmentation" as used herein refers to E and C units in separate n+ moats with the added segmentation option for contacting the E's and for contacting the C's using a plurality of metal stripes (generally M2 stripes) as opposed to a conventional single metal bus. Segmentation is recognized to help prevent filamentation of the current flow during ESD events by a thermal feedback process as described below.

Disclosed surrounded emitter bipolar ESD devices generally have a relatively large perimeter so that ESD strike energy received is spread uniformly throughout the device, which has been found to result in efficient ESD protection as well as pulse width scaling that helps performance in more demanding ESD tests such as International Electrotechnical Committee (IEC) standard testing (see FIG. 4 described below).

The n+ moats can all be doped the same, or can be doped differently to provide different C and E unit doping. When the n+ moats are all doped the same, the function of each of these moats can be determined by its metal connection (e.g., with M2) to either the E routing or the C routing. Thus, the arrangement of E and C units can be determined by the metal routing layout. It was found that the most efficient layout for ESD protection surrounds each E unit with C units, which in one particular embodiment results in a 3:1 ratio of total C area to total E area on the 2D base unit array.

BRIEF DESCRIPTION OF THE DRAWINGS

Reference will now be made to the accompanying drawings, which are not necessarily drawn to scale, wherein:

FIG. 1B is a depiction of a base unit with an n+ moat over the p-base that can act as either a C or E unit, shown being square in shape.

FIG. 1C is a depiction of an example E unit surrounded by C units.

FIG. 3 illustrates a high level depiction of an ESD protected integrated circuit (IC) into which disclosed surrounded emitter lateral bipolar ESD devices are incorporated to protect a plurality of terminals of the IC, according to an example embodiment.

DETAILED DESCRIPTION

Figure 1A:
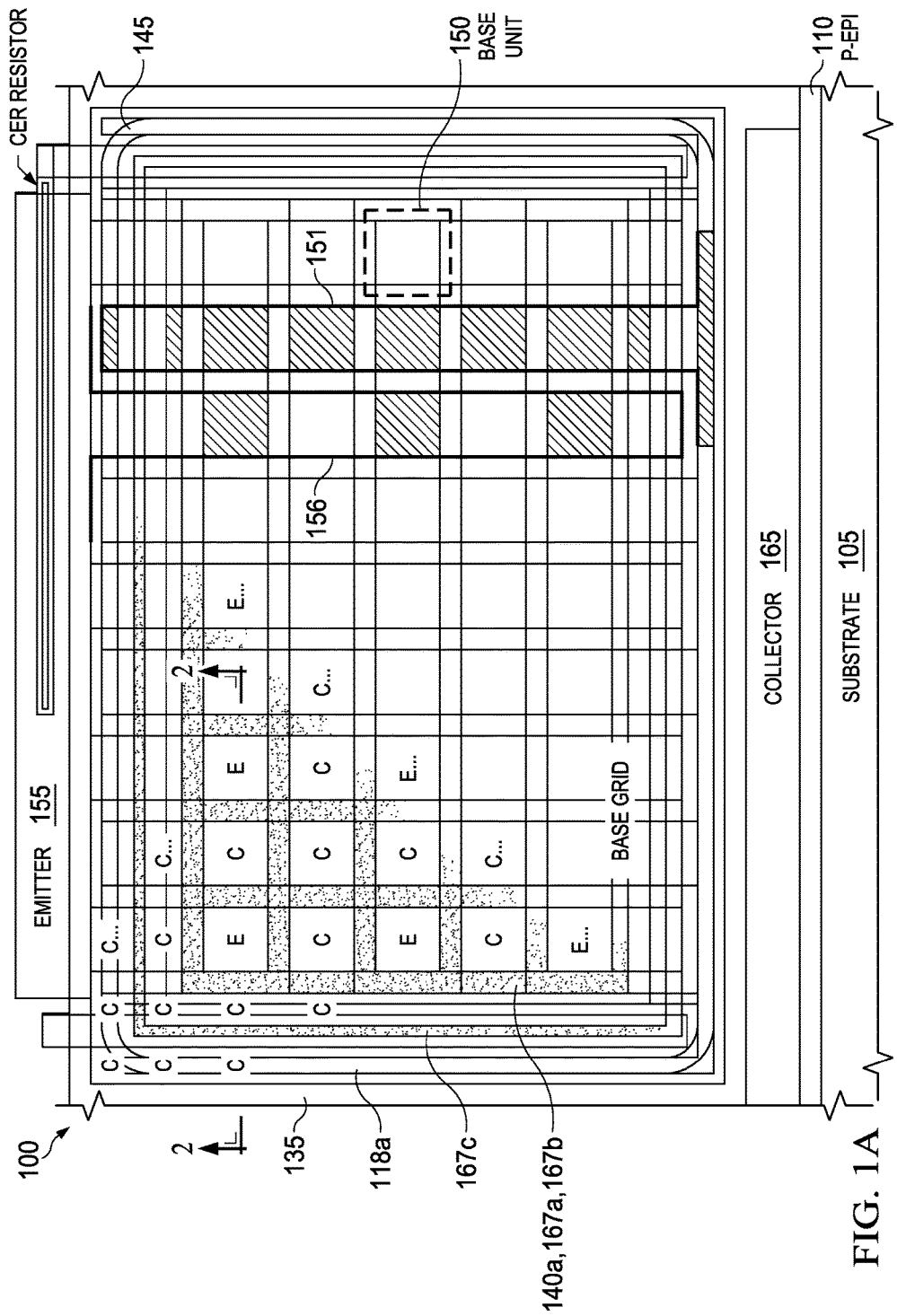
FIG. 1A is a top view of an example surrounded emitter lateral bipolar ESD device having optional C and E segmentation, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 2:
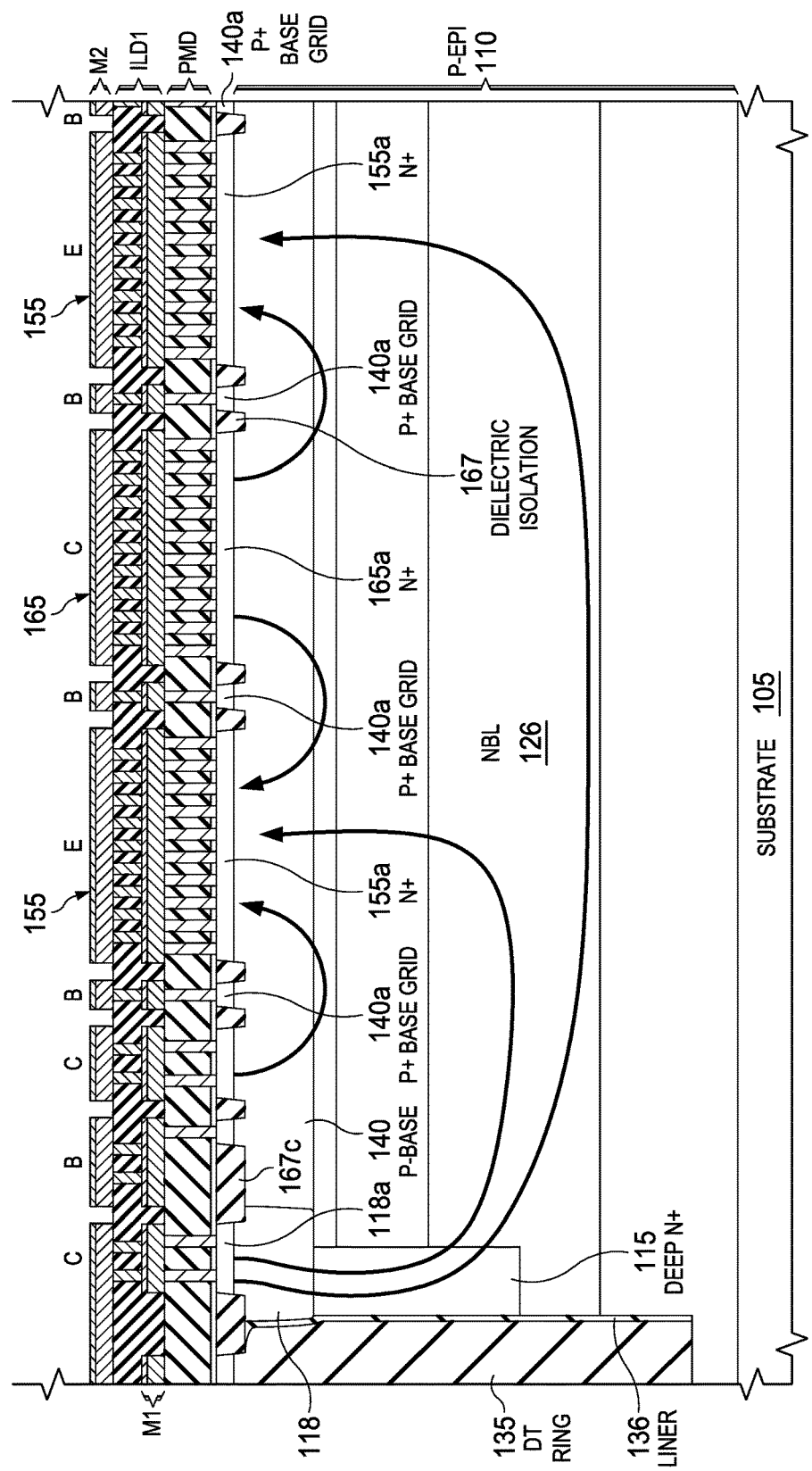
FIG. 2 a cross section depiction as marked in FIG. 1 showing the respective layers and the C to E paths for current flow, according to an example embodiment.

FIG. 1A is a top view of an example surrounded emitter lateral bipolar ESD device 100 having a 2D array of base units 150 each providing a C unit or an E unit, with optional C and E segmentation on a substrate 105. A horizontal or vertical portion of a base grid that contact an underlying p-base 140 (see FIG. 2) separates each base unit 150 from a nearest neighbor base unit. FIG. 1B is a depiction of a base unit 150 with an n+ moat over the p-base 140 that can act as either a C or E emitter unit, shown being square in shape. FIG. 1C is a depiction of an example E unit surrounded by C units. FIG. 2 is a cross section depiction along the cut marked in FIG. 1A showing the respective layers and C to E paths for current flow, according to an example embodiment.

Surrounded emitter lateral bipolar ESD device 100 includes a p-epitaxial layer (p-epi layer) 110 on a substrate 105, and a p-base 140 in the p-epi layer 110 on an optional n+ buried layer (NBL) (see NBL 126 in FIG. 2). The p-epi layer 110 may be 15 μm to 40 μm thick. The substrate 105 is generally a p+ substrate, doped from $1\times10^{16}$ to $1\times10^{19}$ $cm^{-3}$, the p-epi layer 110 can have a doping level from $3\times10^{14}$ $cm^{-3}$ to $3\times10^{16}$ $cm^{-3}$. The substrate 105 and the p-epi layer 110 can both comprise silicon.

Dielectric isolation regions are shown collectively as 167 in FIG. 2 being shallow trench isolation (STI) regions which are in the p-epi layer 110 over the p-base 140, where each base unit 150 includes an outer dielectric structure 167a around an inner dielectric isolation ring 167b as shown in FIG. 1B. The outer dielectric structure 167a for one unit is part of the inner dielectric isolation ring 167b for an adjacent unit. FIG. 1B also shows an inner dielectric isolation ring 167b which surrounds an n region (n+ moat) 160 which can be a C or an E unit. An outer dielectric isolation ring 167c is inside an optional outer deep trench (DT) ring (outer DT ring) 135 which is also shown in FIG. 2.

M1 generally clads the surface of each E and C unit, which can include optional surface silicide, and connections to the collector ring 145 and to the outer DT ring 135 when the outer DT ring 135 includes a dielectric liner 136 having an inner p-doped region (e.g., p+ doped polysilicon). Also, M1 typically generally forms horizontal stripes that connect C units that are vertically in line with the E units, and a M2 layer is generally used to form connections that run out of each cell to avoid metal line collisions shown in FIG. 1A including a plurality of C contact fingers with C finger 151 shown connected to a metal bar shown as a "collector" 165 interdigitated with a plurality of E fingers with E finger 156 shown connected to a metal bar shown as an "emitter" 155 that is interdigitated with the C fingers. The hatched regions shown indicate the C units and the collector ring 145 shown being contacted by the C finger 151 and the E units being contacted by the E finger 156. Alternating rows and columns of n+ moats are shown in FIG. 1A as being all C units, with mixed rows and columns including C and E units between the rows and columns of all C units. A resistor shown as a "CER resistor" is positioned between the emitter 155 and the p-base 140, which can comprise doped polysilicon.

As shown in FIG. 2, the surrounded emitter lateral bipolar ESD device 100 includes a metal stack comprising M2 on ILD1 on M1 on a pre-metal dielectric (PMD), with vias through the ILD1 and PMD on the topside surface of the p-epi layer 110. There can be more than two layers of metal. P+ base contacts are shown as 140a, which are portions of the base grid shown in sectional view. (See FIG. 1A) C units are shown as 165 with n+ C contacts shown as 165a, and the E shown as 155 with n+ E contacts shown as 155a.

There is shown in FIG. 2 an outer DT ring 135 having at a dielectric liner 136. In one embodiment the outer DT ring 135 comprises a dielectric liner 136 having an inner p-doped region (e.g., p+ doped polysilicon) extending from a top surface of the p-epi layer 110 (topside surface) to contact the buried p-epi layer under the NBL 126. An outer n-type diffusion ring (DEEPN region) 115 providing an n+ ring on the sidewall of the dielectric liner 136 is under a surface nwell region 118 having an n+ contact 118a extends outward and downward to the NBL 126, where the DEEPN region 115 encloses a portion of the p-epi layer 110 to define the 2D base unit array. However, the NBL 126 and DEEPN region 115 (together providing an NBL isolation tank) are generally optional as the disclosed lateral NPN structure comprising the 2D base unit array being a lateral (surface) device can still operate as an ESD cell with the anode grounded, so that the NPN device can operate without an NBL isolation tank.

A base metal layer includes a base metal line (e.g., in M1) that contacts a topside surface over the p-base 140. Although not shown, silicide contacts to the top surface of the p-epi layer 110 for contact to the B, and to the C and E units can be used. The C units and E units can in one embodiment be 2 μm to 4 μm in linear dimension.

As shown in FIG. 2 the surrounded emitter lateral bipolar ESD device 100 can be seen to also provide a parallel vertical bipolar path with the NBL 126, DEEPN region 115 and surface nwell region 118 serving as an extra collector. Some of the M2 stripes shown function to "degenerate" the E units including E finger 156 which as described above discourages current filamentation. In other words, if the surrounded emitter lateral bipolar ESD device 100 breaks down in a way that current begins to flow in a localized part of the device, then the M2 layer will develop a voltage drop that de-biases the E unit nearest the filament, causing its local $V_{BE}$ to drop and hence causing an exponential decrease in current flow. As described above, if desired, this effect can be intensified by deleting some of the contacts at each E unit. Deleting contacts increases the resistance of that E, which strengthens the negative feedback involved in degeneration, further discouraging current filamentation during ESD events. The effectiveness of this design can be seen from the Transmission Line Pulse (TLP) testing data described below in FIG. 4.

Emitter segmentation is so that the ESD strike energy is spread uniformly throughout the device, which results in efficient ESD protection as well as pulse width scaling that improves ESD performance in more demanding ESD tests such as IEC. The 2D base unit array can have its base contacts 140a strapped with MET1 to avoid base debiasing across the device.

As noted above, the n+ moats 160 can all be doped the same, or can be doped differently to provide different C and E unit doping. When doped differently, the C units can further comprise a zener diode within that is spaced from an edge of the C units so that a zener diode is form which is connected between the C and base to reduce the trigger voltage, such as to the 6 V to 8V range.

The zener diode is generally formed as a buried device. For example in a BiMOS, there is generally a N+/PWELL junction that is spread across a moat region. If one superimposes another p-type well on this junction, then the PWELL doping can be locally reinforced and the N+ being relatively heavily doped so that the extra p-type well does not substantially alter the net N+ doping. A buried zener can be formed when the mask defining the second p-type well is confined within the moat and does not intersect the edges of the moat. As a result, the zener breakdown will occur preferentially away from the edges of the moat. it is recognized a reason to design the zener breakdown away from the edge is that the oxide (or other dielectric) at the moat edge tends to charge up due to hot carriers created during zener breakdown, which will cause the junction's breakdown voltage to shift, leakage to increase, and eventually failure will occur. A buried zener, however, can generally experience breakdown repeatedly without degradation.

The zener diode can be thus formed by selectively implanting (E units masked) a relatively shallow n-type implant and a relatively deep p-type implant into the C units away from edge of the C units. Another option is to form a zener is to selectively add a shallow n-type implant such as for a BiMOS process an n-type lightly-doped drain (NLDD) implant including and a deeper p-type implant such as a p-pocket implant in the C units away from the edge to reduce the breakdown voltage to the 6-8V range. Yet another option is for the C units to further comprise a selective additional p-type diffusion (e.g., a DWELL diffusion) from a p-type implant added to the C units to reduce the breakdown voltage to the 6 to 8V range.

Advantages of disclosed surrounded emitter lateral bipolar ESD device include no need to use an extra mask (e.g., a DWELL mask) so there is less design, process, and mask cost. In addition, disclosed surrounded emitter lateral bipolar ESD device can be far smaller in size as compared to known vertical bipolar ESD device. For example, a minimum size disclosed lateral NPN ESD device can be just a few unit cells so about 10 µm, which is significantly smaller than a conventional vertical NPN ESD device which requires all of the isolation structures. In addition, as described below disclosed surrounded emitter lateral bipolar ESD devices can sustain a 500 ns TLP pulse that known vertical bipolar ESD devices cannot sustain, making disclosed surrounded emitter lateral bipolar ESD device better suited to system-level ESD standards such as IEC.

FIG. 3 illustrates a high level depiction of a construction of an IC 300 into which disclosed surrounded emitter lateral bipolar ESD devices 100 functioning as ESD protection devices are incorporated to protect one or more terminals of the IC, according to an example embodiment. The "T" indicated at the top of the respective surrounded emitter lateral bipolar ESD device 100 in FIG. 3 represents an input provided by a suitable trigger circuit.

IC 300 includes functional circuitry 324, which is integrated circuitry that realizes and carries out desired functionality of IC 300, such as that of a digital IC (e.g., digital signal processor) or analog IC (e.g., amplifier or power converter). The capability of functional circuitry provided by IC 300 may vary, for example ranging from a simple device to a complex device. The specific functionality contained within functional circuitry 324 is not of importance to disclosed embodiments.

IC 300 also includes a number of external terminals, by way of which functional circuitry 324 carries out its function. A few of those external terminals are illustrated in FIG. 3. It is to be understood that the number of terminals and their function can also vary widely. In the example of IC 300 shown in FIG. 3, two terminals shown operate as common input and output terminals (I/O), by way of which functional circuitry 324 can receive incoming signals and can generate outputs, as well known in the art. A dedicated input terminal IN is also shown in FIG. 3 for IC, as is a dedicated output terminal OUT. Each of terminals IN, OUT are also connected to functional circuitry 324. Power supply terminal Vdd receives a positive power supply voltage in this example, while ground terminal Vss is provided to receive a reference voltage, such as system ground. Although not shown, the ground shown connected to surrounded emitter lateral bipolar ESD device 100 is coupled to VSS, such as resistively coupled or shorted together.

IC 300 includes an instance of a disclosed surrounded emitter lateral bipolar ESD devices 100 connected to each of its terminals. Each surrounded emitter lateral bipolar ESD devices 100 is connected to its corresponding terminal in parallel with the functional circuitry 324. Surrounded emitter lateral bipolar ESD devices 100 are also connected to power supply and reference voltage terminals VDD, VSS, in parallel with functional circuitry 324. However, in some applications, some pins of the device being protected will be self-protecting, such as diode protected power supply pins. Pins also can be protected against different levels of ESD strike (Human Body Model (HBM), Charged Device Model (CDM), IEC, etc.).

EXAMPLES

Disclosed embodiments are further illustrated by the following specific Examples, which should not be construed as limiting the scope or content of this Disclosure in any way.

Figure 4:
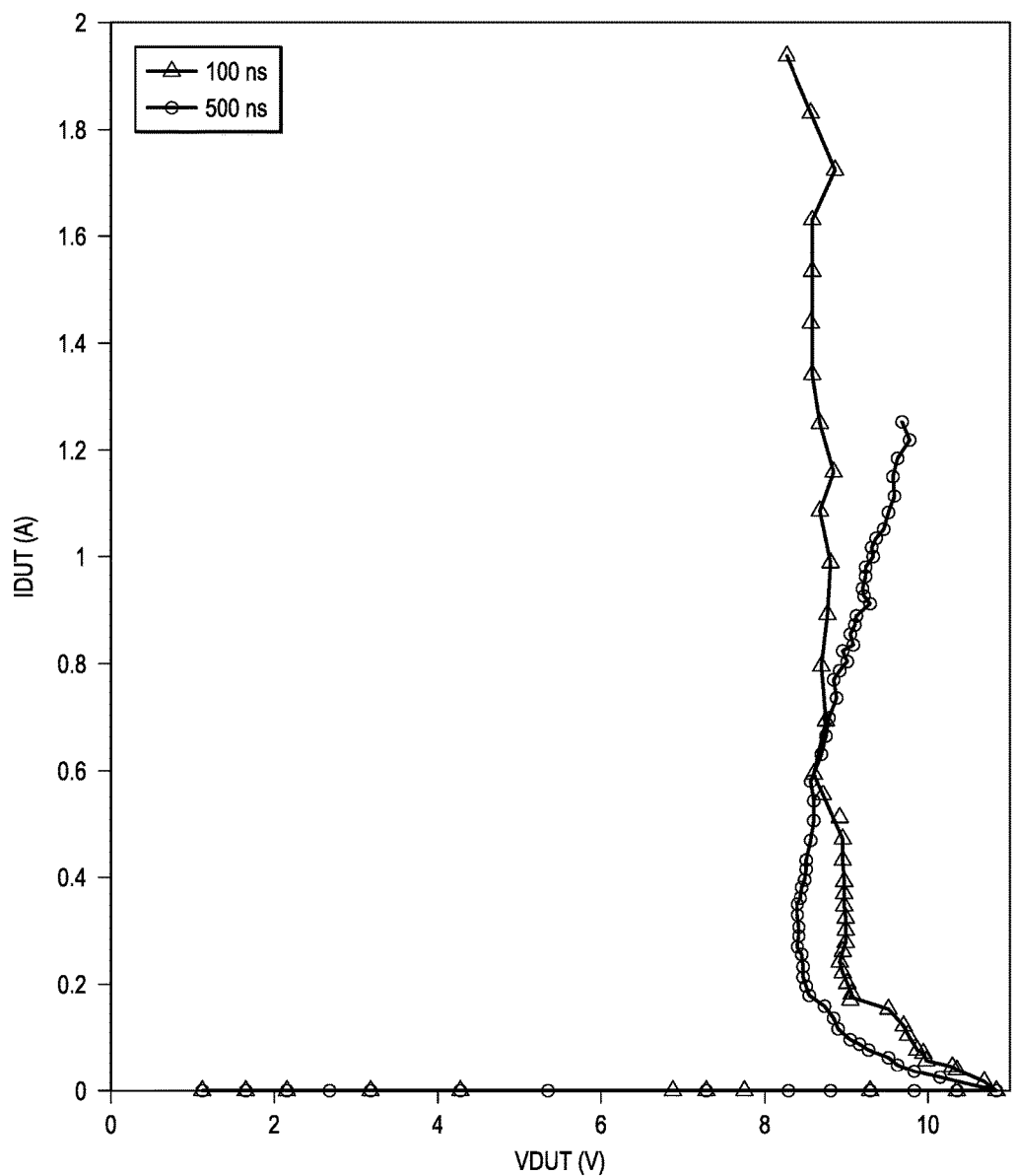
FIG. 4 depicts the ESD performance of an example surrounded emitter lateral ESD device.

Disclosed embodiments are further illustrated by the following specific Examples, which should not be construed as limiting the scope or content of this Disclosure in any way. FIG. 4 depicts the ESD performance for the surrounded emitter lateral bipolar ESD device 100 shown in FIG. 1A at 100 ns and 500 ns TLP pulse widths that shows disclosed devices can support a much higher current density than the vertical NPN device it replaces including 500 ns pulses which allow it to pass system-level ESD tests that previously no NPN clamp could pass. Reliable clamp at about 8.5 V evidencing a reliable voltage clamp and being scalable to longer pulses that are needed for system-level ESD tests.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An electronic device, comprising:
    a substrate having a p-type epitaxial (p-epi) layer thereon;
    a p-base in said p-epi layer;
    a two dimensional (2D) array of base units each including one base contact of a corresponding plurality of base contacts, said one base contact being connected to said p-base and encircling a dielectric isolation ring and an n+ moat that is located in an area enclosed by said dielectric isolation ring; and
    a base grid that includes a regular array of said base contacts and separates each base unit dielectric isolation ring from a dielectric isolation ring of a nearest neighbor base unit.

2. The device of claim 1, further comprising an n+ buried layer (NBL), under said p-base in said p-epi layer, connected to an outer collector ring that encloses an area including said base grid and said array of base units.

3. The device of claim 1, further comprising:
    a collector electrode having a plurality of collector fingers, each collector finger connected to each base contact in a first corresponding column of said base contacts; and
    an emitter electrode having a plurality of emitter fingers, each emitter finger located between neighboring collector fingers, and each emitter finger connected to a proper subset of said p-base contacts in a second corresponding column of said base contacts,
    wherein said base contacts connected to said collector electrode are designated C units, and said base contacts connected to said emitter electrode are designated E units.

4. The device of claim 2, further comprising an outer deep trench isolation ring (outer DT ring) framing said 2D array, and a deep n+ diffusion region located adjacent a sidewall of said outer DT ring and between a surface nwell region and said NBL.

5. The device of claim 3, wherein n+ moats of said C units are doped differently from n+ moats of said E units.

6. An integrated circuit (IC), comprising:
    a substrate having a p-type epitaxial (p-epi) layer thereon;
    functional circuitry formed using said p-epi layer and configured to realize and carry out a functionality and having a plurality of terminals including at least a first terminal and a ground terminal;
    at least one transistor formed in said p-epi layer and coupled between said first terminal and said ground terminal in parallel with said functional circuitry, said transistor including:
        a p-base in said p-epi layer;
        a two dimensional (2D) array of base units each including one base contact of a corresponding plurality of base contact, said one base contact being connected to said p-base and encircling a dielectric isolation ring and an n+ moat that is located within said dielectric isolation ring, and
        a base grid that includes a regular array of said base contacts and separates each dielectric isolation ring from a nearest neighbor dielectric isolation ring.

7. The IC of claim 6, further comprising an n+ buried layer (NBL) located under said p-base in said p-epi layer and connected to an outer collector ring that encloses an area including said base grid and said array of base units.

8. The IC of claim 6, further comprising:
    a collector electrode having a plurality of collector fingers, each collector finger connected to each base contact in a first corresponding column of said base contacts; and
    an emitter electrode having a plurality of emitter fingers, each emitter finger located between neighboring collector fingers, and each emitter finger connected to alternating base contacts in a second corresponding column of said base contacts,
    wherein said base contacts connected to said collector electrode are designated C units, and said base contacts connected to said emitter electrode are designated E units.

9. The IC of claim 7, further comprising an outer deep trench isolation ring (outer DT ring) framing said 2D array, and a deep n+ diffusion region located adjacent a sidewall of said outer DT ring and between a surface nwell region and said NBL.

10. The IC of claim 6, wherein said n+ moats have a same doping.

11. The IC of claim 8, wherein the n+ moat of each of said C units further includes a relatively shallow additional n-type doping and a relatively deep additional p-type doping that is spaced apart from an edge of said moat to provide a buried Zener diode within said moat.

12. The IC of claim 6, wherein said functional circuitry comprises a BiMOS IC device.

13. The integrated circuit of claim 6, further comprising an n+ buried layer (NBL) located under said p-base in said p-epi layer and connected via a deep n+ diffusion region to a collector electrode ring that surrounds said plurality of base contacts and is connected to a proper subset of said p-base contacts.

14. The device of claim 3, wherein said C units have a total area that is between two (2) times and five (5) times a total area of said E units.

15. The bipolar device of claim 3, wherein said collector electrode includes a collector ring around said plurality of base contacts and connected to the collector fingers.

16. A transistor, comprising:
    a substrate having a well of a first conductivity type;
    an array of moats within said well, said moats having a second conductivity type; and
    a grid region of said first conductivity type within said well, said grid region being doped to a higher carrier concentration than said well and including a plurality of continuous intersecting vertical and horizontal linear doped regions that separate each of said moats from a nearest neighbor moat.

17. The transistor of claim 16, further comprising a ring electrode surrounding said moats and connected via a vertical current path to a buried doped layer of the second conductivity type underlying the well.

18. The transistor of claim 16, wherein said first conductivity type is p-type, and said second conductivity type is n-type.

19. The transistor of claim 16, further comprising a plurality of collector fingers interdigitated with a plurality of emitter fingers, each emitter finger being connected to a first subset of moats (E units), and each collector finger being connected to a second subset of moats (C units), wherein each of said E units is separated from a nearest neighboring E unit by one of said C units.

20. The transistor of claim 19, wherein the moat of each of said C units includes a buried Zener diode.

* * * * *